(12) United States Patent
Coronel et al.

(10) Patent No.: US 7,214,597 B2
(45) Date of Patent: May 8, 2007

(54) ELECTRONIC COMPONENTS AND METHOD OF FABRICATING THE SAME

(75) Inventors: Philippe Coronel, Barraux (FR);
Francois Leverd, Saint Ismier (FR);
Thomas Skotnicki, Crolles (FR)

(73) Assignee: STMicroelectronics S.A., Montrouge (FR)

( * ) Notice: Subject to any disclaimer, the term of this patent is extended or adjusted under 35 U.S.C. 154(b) by 163 days.

(21) Appl. No.: 10/421,368

(22) Filed: Apr. 23, 2003

(65) Prior Publication Data
US 2004/0033676 A1    Feb. 19, 2004

(30) Foreign Application Priority Data
Apr. 23, 2002   (FR)   .................... 02 05073

(51) Int. Cl.
H01L 21/46   (2006.01)
H01L 21/30   (2006.01)
(52) U.S. Cl. ............... 438/455; 438/484; 257/E21.309; 257/E21.415
(58) Field of Classification Search ............. 438/624, 438/401, 455–459, 975, 977, 464, 106, 484
See application file for complete search history.

(56) References Cited

U.S. PATENT DOCUMENTS

| | | | |
|---|---|---|---|
| 4,317,125 A * | 2/1982 | Hughes et al. ............. 257/275 |
| 4,968,628 A * | 11/1990 | Delgado et al. ............ 438/406 |
| 5,004,705 A * | 4/1991 | Blackstone ................ 438/455 |
| 5,244,817 A | 9/1993 | Hawkins et al. |
| 5,369,050 A * | 11/1994 | Kawai ...................... 438/401 |
| 5,436,173 A | 7/1995 | Houston |
| 5,506,163 A * | 4/1996 | Moriya ...................... 438/155 |
| 6,066,513 A * | 5/2000 | Pogge et al. ............... 438/113 |
| 6,110,806 A * | 8/2000 | Pogge ....................... 438/458 |

(Continued)

FOREIGN PATENT DOCUMENTS

WO    WO 00/36383    6/2000

OTHER PUBLICATIONS

Van Zant MicroChip Fabrication, 4th ed. McGraw Hill 2000. p. 559.*

(Continued)

*Primary Examiner*—Alexander Ghyka
(74) *Attorney, Agent, or Firm*—Lisa K. Jorgenson; Stephen Bongini; Fleit, Kain, Gibbons, Gutman, Bongini & Bianco P.L.

(57) ABSTRACT

A method is provided for fabricating integrated electronic components. According to the method, an initial structure is produced on the surface of a first substrate. This initial structure incorporates a defined pattern formed from volumes of differentiated materials. At least part of the initial substrate that includes the defined pattern is transferred onto a second substrate, preferably by inverting the first substrate against the second substrate and then removing the first substrate. An additional structure is then produced on the second substrate. This additional structure includes volumes of material placed in correspondence with some of the volumes of differentiated material of the defined pattern. The electronic components thus produced may have a suitable configuration in accordance with technological or geometrical constraints. In a preferred method, a selective treatment is applied to the transferred part of the initial structure, so as to make a distinction between the volumes of differentiated material of the pattern.

22 Claims, 6 Drawing Sheets

U.S. PATENT DOCUMENTS

| | | |
|---|---|---|
| 6,329,265 B1 | 12/2001 | Miyawaki et al. |
| 6,335,224 B1 * | 1/2002 | Peterson et al. ............. 438/114 |
| 6,392,144 B1 * | 5/2002 | Filter et al. ................. 174/52.4 |
| 6,701,779 B2 * | 3/2004 | Volant et al. .................. 73/105 |
| 6,709,949 B2 * | 3/2004 | Hubner ....................... 438/401 |
| 2001/0032987 A1 | 10/2001 | Narui et al. |

OTHER PUBLICATIONS

XP 000167661 on Oct. 3, 1989, by R. P. Zingg et al., Dual-Gate SOI CMOS Technology by Local Overgrowth (LOG), Proceedings of the Annual SOS/SOI Technology Conference.

* cited by examiner

US 7,214,597 B2

ELECTRONIC COMPONENTS AND METHOD OF FABRICATING THE SAME

CROSS-REFERENCE TO RELATED APPLICATIONS

This application is based upon and claims priority from prior French Patent Application No. 02-05073, filed Apr. 23, 2002, the entire disclosure of which is herein incorporated by reference.

BACKGROUND OF THE INVENTION

1. Field of the Invention

The present invention relates to a method of fabricating integrated electronic circuits, and in particular to the production of complex structures intended to constitute parts of electronic components on the surface of a semiconductor substrate.

2. Description of Related Art

The production of electronic components on the surface of a semiconductor substrate results in general from a complex process which is subject to constraints of various types. Such constraints relate, for example, to the arrangement of the various components, or parts of components, with respect to one another, in order to allow these components to operate in the desired manner. Other constraints, of a geometrical nature, result from the technological trend pertaining to this type of component towards ever higher levels of integration. This trend necessitates the design of more compact arrangements of components, which cannot be achieved by standard fabrication processes for integrated circuits. Yet other constraints may be of a mechanical nature, associated with the deformation liable to occur when the components are heated.

Moreover, when several levels of components or parts of components are superposed on top of the surface of a substrate, the lower levels (those closest to the surface of the substrate) are generally produced first, before the upper levels (those furthest from the surface of the substrate). The reason for this order of production is that it is expedient to be able to have access to each level of the components, during its production, via a free face of the component during production, in general the face on the opposite side to the substrate. However, certain materials incorporated into upper levels may have to be subjected in situ to heat treatments at high temperature, whereas materials incorporated into lower levels would be degraded by such heat treatments.

In practice, a compromise must often be accepted between certain characteristics of the final components and constraints such as those mentioned above.

It is known to produce components or parts of components on a first substrate and then to transfer them onto the surface of a second substrate. To do this, an initial structure corresponding to parts of components is produced on a surface of the first substrate. This first substrate is then inverted and applied against a surface of the second substrate via the initial structure. After the two substrates have been bonded together, the first substrate is removed, leaving at least part of the initial structure on the second substrate. The forming of electronic components can then be continued with the production of an additional structure on top of the initial structure portion that was transferred from the first substrate to the second.

The process of bonding the first substrate to the second substrate, by bringing a portion of the initial structure into contact with a portion of the surface of the second substrate, is known. Such a process is called molecular bonding, or wafer bonding. The surface portions of the initial structure and of the second substrate which are brought into contact with one another in such a process are usually silicon or silica portions, which are able to exhibit good adhesion between themselves when they contain no trace of foreign elements.

Removal of the first substrate, which occurs after the wafer bonding step, is carried out so as to leave at least part of the initial structure on the second substrate. This removal may be achieved by various known methods. In particular, the first substrate may be removed by polishing and/or by plasma etching. In other words, the two steps—wafer bonding and removal of the first substrate—allow the initial structure to be transferred onto the second substrate after the initial structure has been produced on the first substrate.

Such a process makes it possible to transfer, onto the surface of the second substrate, first materials that have undergone beforehand a heat treatment at high temperature, on top of second materials that would degrade at such a temperature. For this purpose, the heat treatment is applied to the first materials while they are supported by the first substrate, during production of the initial structure, and while the materials liable to be degraded have not yet been covered by the initial structure.

Such a process also makes it possible to provide, within the arrangement of the components or parts of components, volumes left empty of material, which affect the electronic behavior of the components.

One drawback of these types of methods which proceed by transferring an initial structure between two substrates appears during the continuation of the production of the structure on top of the initial structure portion that is transferred. This is because there is a need for a step of alignment between the second substrate supporting the initial structure portion transferred and a tool intended to produce the aforementioned additional structure. In practice, this step often involves positioning a photolithography mask in relation to the initial structure portion. However, this mask positioning step is complex and often requires several adjustments in order to obtain sufficient alignment precision.

Furthermore, the high levels of integration currently sought, corresponding for example to 0.12 micron or 0.10 micron technologies, or yet even finer technologies, appear to be incompatible with an intervening positioning step while certain of the components are only partly produced. This is because the alignment uncertainty currently obtained is on the order of, or even greater than, the dimensions of certain parts of components included in the initial structure portion that is transferred between the two substrates. As an example, the most precise methods currently used to align a photomask with respect to a substrate have a residual uncertainty of 60 nanometers. Even if this residual uncertainty were to be reduced, for example down to 45 nanometers, it would remain too great for already envisaged technologies for fabricating transistors having gates 30 nanometers in width.

SUMMARY OF THE INVENTION

In view of these drawbacks, it is an object of the present invention to remove the above-mentioned drawbacks and to compensate for the imprecision in positioning the tools for producing an additional structure with respect to an initial structure portion that was transferred between first and second substrates.

One embodiment of the present invention provides a method of fabricating integrated electronic components. According to the method, an initial structure is produced on the surface of a first substrate, with the initial structure including a plurality of volumes of materials, some of which form a defined pattern. At least a part of the initial structure that includes the defined pattern is transferred from the first substrate onto a second substrate, and an additional structure is produced on the second substrate using at least some of the volumes of materials of the defined pattern as self-alignment marks of the additional structure with respect to the part of the initial structure. In a preferred method, the transfer is performed by inverting the first substrate, applying the first substrate against the second substrate via the initial structure, and removing the first substrate.

Another embodiment of the present invention provides an integrated electronic component. The electronic component is fabricated by a method in which an initial structure is produced on the surface of a first substrate, with the initial structure including a plurality of volumes of materials, some of which form a defined pattern; at least part of the initial structure that includes the defined pattern is transferred from the first substrate onto a second substrate; and an additional structure is produced on the second substrate using at least some of the volumes of materials of the defined pattern as alignment marks. In one embodiment, the integrated electronic component comprises a transistor.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
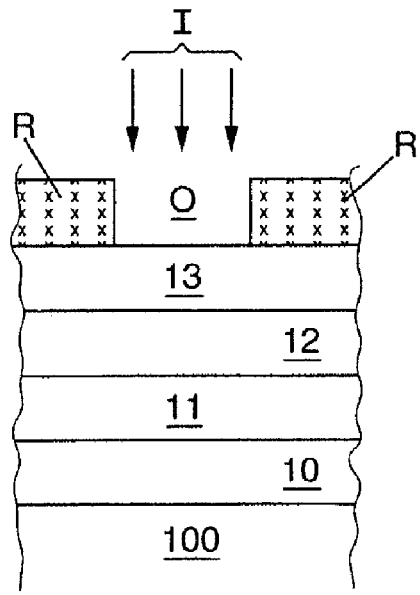
FIGS. 1 to 5 illustrate a method according to a preferred embodiment of the present invention in which materials differentiated by ion implantation are used.

Preferred embodiments of the present invention will be described in detail hereinbelow with reference to the attached drawings.

Preferred embodiments of the present invention provide a method of fabricating integrated electronic components. According to the method, an initial structure incorporating a plurality of volumes of respective materials is produced on the surface of a first substrate, with some of these volumes forming a defined pattern. At least a part of the initial structure that includes the pattern is transferred from the first substrate onto a second substrate, and an additional structure is produced on the surface of the second substrate using at least some of the volumes of materials of the pattern as alignment marks.

Thus, the method of the present invention allows the additional structure to be self-aligned with respect to the transferred part of the initial structure portion, on top of which an additional structure is produced.

A first advantage of the method of the present invention lies in the suppression of a step for precisely positioning, with respect to the second substrate, tools intended to be used in the production of the additional structure. In other words, precise positioning of tools is not necessary to produce the additional structure on the second substrate. The alignment is self-obtained by material removal or deposition above the second substrate as explained in detail below.

A second advantage of the method of the present invention lies in the possibility of obtaining a stack of materials placed on a substrate, which stack includes, in an upper part of the stack, second materials that have undergone a heat treatment which cover first materials that have not undergone this heat treatment. This makes it possible to at least partially overcome, during the design of the fabrication process for a defined number of components on a substrate, the constraint of correlation between the heat treatments needed for certain parts of components and the chronological order of production of these parts of components.

A third advantage of the method of the present invention lies in the possibility of arranging various parts of components with respect to one another in a manner particularly suitable for obtaining a high level of integration. Thus, component densities per unit area of substrate never before obtained can be achieved.

Optionally, after the step of producing the initial structure, the initial structure may include, at certain points on the surface of the first substrate, at least two stacked levels of volumes of material. Some of the volumes of material which form the pattern may also be covered, at this point in the method, with volumes of material belonging to the initial structure. These volumes of material of the pattern therefore constitute a reference mark buried in the initial structure, or buried imprint, which is used, according to the present invention, for the self-alignment of the additional structure with respect to the initial structure portion that is transferred between the two substrates.

The materials of different volumes of the pattern may have different chemical compositions. To do this, the step of producing the initial structure can include a treatment for differentiating at least one of the volumes of material forming the pattern from the other volumes of material forming the pattern. This treatment may, for example, be the specific deposition of a defined material in at least one volume of the pattern, resulting in a particular chemical composition.

Another treatment allowing some of the volumes of material of the pattern to be differentiated involves implanting defined chemical species into the initial materials of these volumes. Thus, two volumes of the same initial material belonging to the pattern may correspond to different materials after an implantation step has been carried out in one of them.

Yet another treatment allowing materials of different volumes of the pattern to be differentiated involves causing a chemical reaction in some of the volumes of material of the pattern. Such a reaction may, for example, be generated by bringing a surface of one of these volumes into contact with a gas in order to form, on the surface, a solid compound that is capable of protecting the material filling the rest of this volume.

The method may further include, between the transferring step and the step of producing the additional structure, the formation of an access to at least part of the volumes of the pattern. A selective treatment can then be carried out through this access, so as to make it possible to distinguish at least one of the volumes of material forming the pattern from the other volumes of material forming the pattern. This selective treatment may be of various types, such as an etching treatment using a solution incorporating chemical reactants ("wet etching"), etching using a plasma ("dry etching"), or else selective deposition of material on surfaces of some of the volumes of material of the pattern. This selective deposition may be chemical deposition, especially chemical vapor deposition (CVD), deposition by epitaxial growth from at least one surface of a crystalline material of one of the volumes of the pattern, etc.

Depending on the nature of the selective treatment used, pairs of materials that can be distinguished by the selective treatment are, for example: silicon and silica ($SiO_2$), or two materials based respectively on silicon and silica (silicon and silica have different chemical reactivities with respect to certain chemical compounds in solution); silicon nitride ($Si_3N_4$) and a material such as silicon, or two materials one of which is based on silicon nitride (silicon nitride can withstand certain etching processes used for ablating many other materials); silicon and a silicon-germanium alloy, or a material based on silicon and an alloy including silicon and germanium (silicon-germanium alloys can be dissolved by wet etching using solutions that are both oxidizing and acidic, to which solutions pure silicon is resistant, and these alloys may be obtained by epitaxial deposition from crystalline silicon surfaces); pure silicon and silicon incorporating boron, or materials based on each of them (such pairs of differentiated materials are often chosen for the ease of incorporating boron into silicon, especially by implanting molecules of boron difluoride ($BF_2$), and the polycrystalline silicon can then be dissolved by wet etching using a mixture of sodium hydroxide (NaOH) and potassium hydroxide (KOH), whereas the boron-implanted polycrystalline silicon is not altered by such a mixture); and crystalline, polycrystalline or possibly single-crystal silicon, and any different material (when the selective treatment is, for example, deposition by epitaxial growth of silicon from at least one surface of the crystalline silicon).

In one preferred method, the materials of certain volumes of the initial structure, by means of which materials the first substrate supporting the initial structure is applied against the second substrate, are suitable for adhering to the surface portion of the second substrate. These suitable materials may, for example, be based on silicon or silica. Likewise, the second substrate may be covered with such a material so as to contribute to good adhesion of the initial structure to its surface.

The present invention also relates to an electronic component that is produced by such a method. Such a component is, for example, a transistor of the type having two superposed gates parallel to the surface of the substrate, or a diode of the type in which the junction surface is plane and parallel to the surface of the substrate. The present invention furthermore relates to an integrated electronic circuit which includes such a component. This electronic circuit may be, in particular, a dynamic random access memory (DRAM).

Exemplary embodiments of the present invention will now be described with reference to the figures. In these figures, for the sake of clarity, the dimensions of the various parts of components shown are not in proportion with their actual dimensions. All of these figures are sectional views of one or more substrates, each supporting various materials placed on a plane surface of the substrate. The sectional views are in planes perpendicular to the surface of the substrate. In the figures, identical references correspond to identical elements. In all the figures, D denotes a direction perpendicular to the surface of the substrate or substrates.

Moreover, in what follows, the individual method steps carried out according to methods known to those skilled in the art are not explained in detail. Indications are only given relating to the combination of these individual steps in a defined chronological order of execution in accordance with the present invention.

As a first example of an embodiment of the method of the present invention, FIG. 1 shows a substrate 100, for example a silicon semiconductor substrate, that supports a stack of superposed layers on a surface. This stack includes, starting from the surface of the substrate 100, a layer 10 of silica ($SiO_2$), a first silicon layer 11, for example polycrystalline silicon, a second silica layer 12 and a second silicon layer 13. Using a photolithography process, a resin mask R is deposited on top of the second silicon layer 13. The mask R has an aperture O.

Ion implantation of boron is then carried out through the aperture O of the mask R, for example by a beam I of ionized boron difluoride ($BF_2$) molecules accelerated by a given electrical voltage. The electrical voltage is chosen so that the implanted boron atoms are localized within the stack at a depth level corresponding to the first silicon layer 11. The obtained volume 14 (FIG. 2) of silicon implanted with boron is bounded transversely (i.e., in a direction perpendicular to the direction D) by the internal edges of the mask R and, in a direction parallel to the direction D, by the silica layers 10 and 12.

Figure 2:
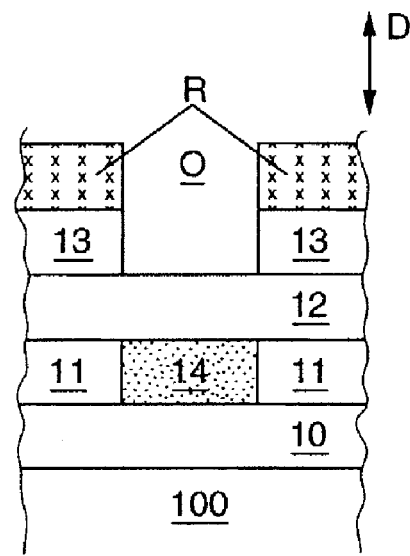

By carrying out a directional plasma etching operation, parallel to the direction D, using a known dry etching process, part of the silicon layer 13 is also removed in the aperture O of the mask R. Such a process includes, for example, a step of exposure to a plasma containing a fluorinated gas such as hydrogen fluoride (HF) or sulfur hexafluoride ($SF_6$). Such reactive gases allow ablation of silicon material without the removal of silica material. During this exposure, electrodes are positioned and raised to defined electrical potentials in order to cause progressive ablation of the silicon as an ablation front which moves parallel to the direction D, toward the substrate 100. The obtained configuration of the structure supported by the substrate 100 is shown in FIG. 2. In this configuration, a portion of the silicon layer 13 has been removed.

The resin mask R is then removed, using a known method, for example by mechanical abrasion. In the volume left free by the removed portion of the layer 13 there is then deposited, as an example, silicon doped so as to have an n-type electrical conductivity, in order to form a doping region 15. Such a deposition is preferably carried out by plasma-enhanced chemical vapor deposition (PE-CVD). This deposition step is generally followed by a chemical mechanical polishing (CMP) step or an anisotropic etching step, with the latter step being possible when the volume 15 has small dimensions in a plane parallel to the surface of the substrate 100.

Figure 3:
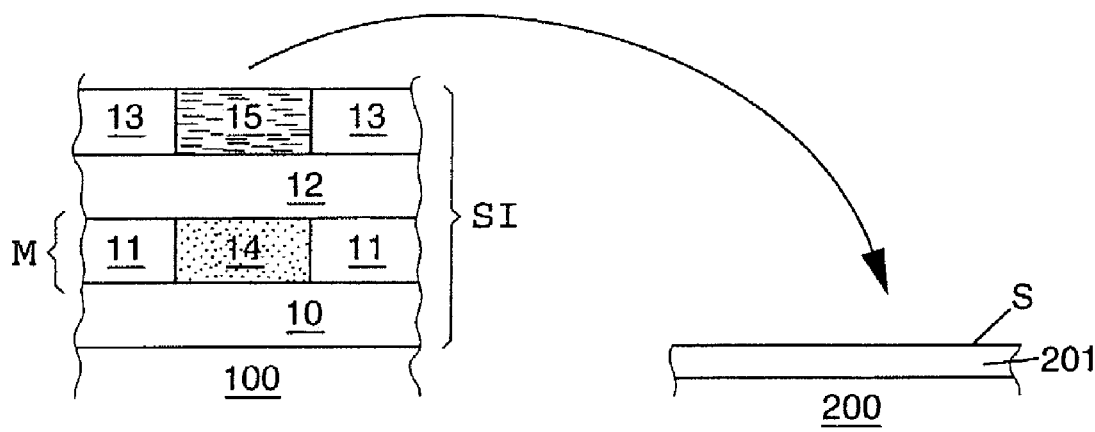

The obtained configuration is shown in FIG. 3. This configuration includes, on the substrate 100, an initial structure SI having the first silica layer 10, the silicon layer 11 having a volume 14 of boron-implanted material, the second silica layer 12 and the silicon layer 13 having the region 15. The volume 14 of boron-implanted silicon within the silicon layer 11 constitutes a pattern M. This pattern M is, in the example depicted, buried in the initial structure SI in the sense that it is entirely covered by the layers 12 and 13 and by the region 15.

Figure 4:
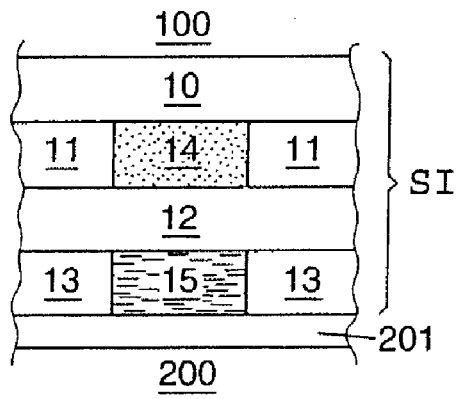

The substrate 100 supporting the initial structure SI is then inverted and applied (FIG. 3) against a surface S of another substrate 200, for example also made of silicon. The substrate 200 preferably includes a silica layer 201 at least 50 nanometers in thickness on its surface S, obtained, for example, by oxidizing the surface of the substrate 200 through heating in an oven. The layer 13 and the region 15 are brought into contact with the surface S of the substrate 200 and bonded to it using the technique of wafer bonding. The configuration obtained is shown in FIG. 4. As shown, the initial structure SI is between the two substrates 100 and 200.

The substrate 100 is then removed, using one of the known methods. Such a method includes, for example, a first phase of mechanically abrading the substrate 100 over almost the entire thickness of the substrate 100, with this thickness being regarded in the direction D. This removal is then completed, for example, by dry etching so as to remove the residual thickness of substrate 100 and the silica layer 10. Such etching may be carried out in two steps: first, the residual thickness of substrate 100 is removed selectively with respect to the silica layer 10 and then the silica layer 10 is removed selectively with respect to the materials of the layer 11 and the volume 14. Each of these two steps preferably uses a plasma into which a selective etching gas is introduced, such as sulfur hexafluoride ($SF_6$) in the case of the first step and $C_4F_8$ in the case of the second step.

Figure 5:
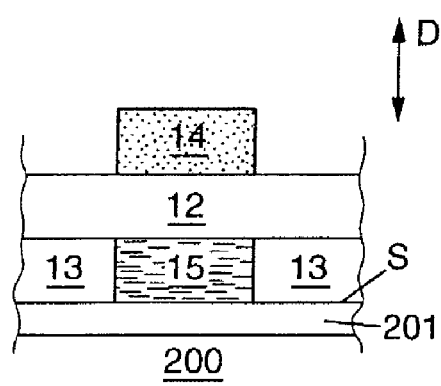

A wet etching step is then carried out, preferably using a solution containing a mixture of sodium hydroxide (NaOH) and potassium hydroxide (KOH). As is known, such a solution selectively dissolves the polycrystalline silicon of the layer 11 without altering the boron-implanted polycrystalline silicon present in the volume 14. The structure shown in FIG. 5 is then obtained. This structure includes, on the surface S of the substrate 200, the region 15 included in the silicon layer 13, and covered by the silica layer 12. According to preferred embodiments of the present invention, the volume 14 of boron-implanted silicon which is present on the silica layer 12 constitutes a reference mark placed vertically in line with the buried region 15 beneath the silica layer 12. This reference mark is positioned very precisely above the region 15, with precise alignment of the sides of the volume 14 with respect to the sides of the region 15 to within about 10 nanometers, considered in a plane parallel to the surface of the substrate 200. By virtue of this reference mark, the structure on the substrate 200 can then be completed, by being aligned with respect to the region 15.

The production of a diode will now be described as a second embodiment of the method of the present invention. The starting configuration is again the silicon substrate 100 covered with the layers 10–13 enumerated in the previous example, and with the resin mask R having the aperture O (FIG. 1). In this embodiment, the layer 11 is made of polycrystalline silicon. Optionally, a commercial SOI (silicon-on-insulator) substrate may be used, which includes a silicon base 100, the silica layer 10 and the upper silicon layer 11. Dry etching is carried out so as to hollow out, via the aperture O, a well P through the layer 13, the layer 12 and the layer 11 in succession along the direction D.

Figure 6:
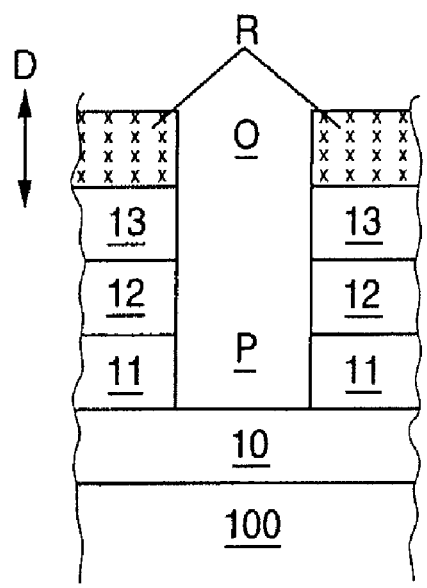
FIGS. 6 to 10 illustrate the production of a diode using another embodiment of the method of the present invention.

This etching is preferably carried out by successively exposing the structure of FIG. 1 to a plasma containing a gas such as sulfur hexafluoride ($SF_6$) or hydrogen chloride (HCl) capable of etching the polycrystalline silicon, and then to a plasma containing a gas such as $C_4F_8$ capable of etching the silica. The silicon layer 11 is then etched in the same way as the layer 13. According to a known method, the etching is stopped when the bottom of the well P reaches the silica layer 10. Such a method consists, for example, in again introducing to the etching plasma a fluorinated gas such as $C_4F_8$ capable of reacting with oxygen atoms produced when the etching front reaches an oxide material. Molecules of carbon monoxide (CO) are then formed and detected by optical emission. Etching of the well P is then interrupted when molecules of carbon monoxide are detected, which indicate that the silica layer 10 has been reached by the bottom of the well being formed. The structure shown in FIG. 6 is therefore obtained.

Next, a crystalline silicon-germanium alloy is deposited on the bottom of the well P, from the sides of this well in the silicon layer 11, so as to fill a volume 16 extending, from the bottom of the well P as far as a height level corresponding to the boundary between the layer 11 and the layer 12. This volume 16 of alloy is an alignment reference mark that will be used in the final step in the fabrication of the diode (see below).

Figure 7:
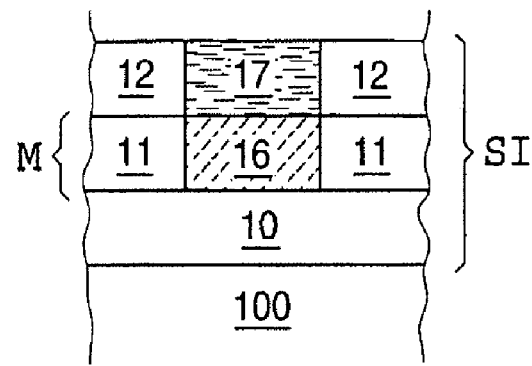

In addition, n-doped silicon, for example containing phosphorus or arsenic atoms, is deposited in the well P, on top of the volume 16 up to height level corresponding to (or slightly above) the boundary between the layer 12 and the layer 13. A volume 17 within the layer 12, on top of the volume 16, is thus obtained. The resin mask has been removed and planarization polishing is carried out on the surface 12 so as to level the volume 17 with respect to the surface of the layer 12. The obtained configuration is shown in FIG. 7. The substrate 100 then supports the initial structure SI formed by the volumes 16 and 17 lying within the layers 11 and 12, respectively. The volume 16 and the layer 11 constitute a pattern M.

Figure 8:
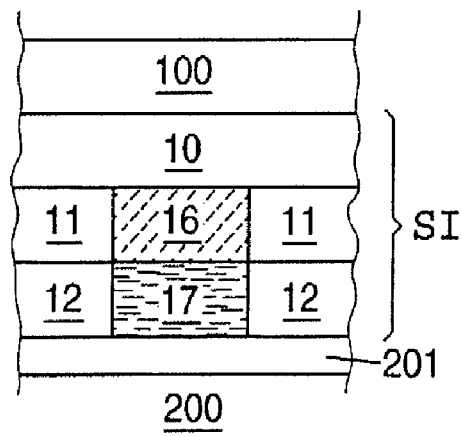

In the same way as in the first embodiment, the substrate 100 with the initial structure SI is then inverted and applied against the surface of a second substrate 200 covered with a silica layer 201. The surfaces of the layer 12 and of the volume 17 on the side opposite to the substrate 100 are thus brought into contact with that surface of the silica layer 201 which is on the side opposite to the substrate 200 (FIG. 8). In addition, the substrate 100 and the layer 10 are then removed, so as to expose those surfaces of the crystalline silicon layer 11 and of the volume 16 of silicon-germanium alloy that are on the opposite side to the substrate 200.

Figure 9:
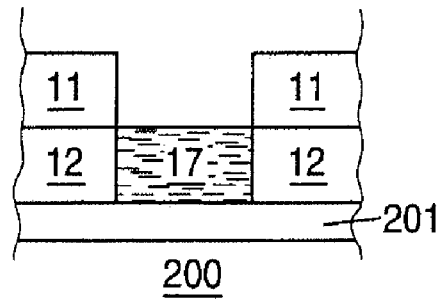

The selective treatment applied for this purpose at these exposed surfaces is preferably a selective wet etching treatment of the silicon-germanium alloy. Such selective etching uses, for example, an aqueous oxidizing solution composed of 40 milliliters of 70% nitric acid ($HNO_3$), 20 milliliters of hydrogen peroxide ($H_2O_2$) and 5 milliliters of 5% hydrofluoric acid (HF). The silicon-germanium alloy of the volume 16 is dissolved on contact with this solution, whereas the pure silicon of the layer 11 and the doped silicon of the volume 17 are left intact. The configuration of the structure obtained after this selective treatment is shown in FIG. 9.

Figure 10:
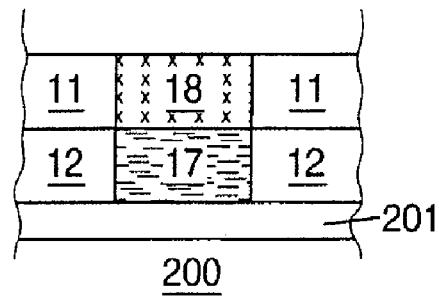

Doped silicon is then deposited on top of the layer 11 and the volume 17 so as to exhibit p-type electrical conductivity. The silicon deposited contains, for example, boron atoms. After removing, preferably by abrasion, any surplus of p-doped silicon deposited, the configuration shown in FIG. 10 is obtained. This configuration includes the two volumes 17 and 18 in exact superposition with respect to each other, which volumes may constitute, respectively, the cathode and the anode of a diode whose junction surface is parallel to the surface of the substrate 200.

A third embodiment of the method of the present invention relates to the production of an MOS transistor having two gates placed on either side of a conduction channel. As is known, this type of transistor allows the current flowing in the channel to be controlled particularly precisely by the electrical potential applied to the gates. To do this, the two gates must be placed symmetrically with respect to the channel, by being correctly aligned with respect to each other, and with good reproducibility so as to reduce any dispersion in the electrical properties of the fabricated transistors.

The various process steps involved in the production of the transistor will not all be described in detail because their respective methods of implementation are well known. Only the chronological sequence according to the third embodiment of the present invention will be described.

Figures 11, 12:
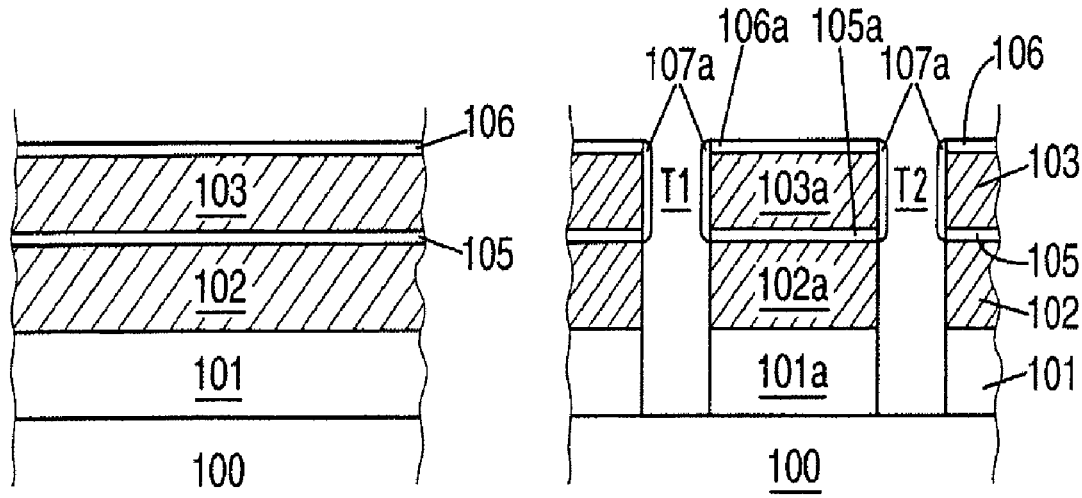
FIGS. 11 to 17 illustrate the production of a transistor by an embodiment of the method of the present invention.

FIG. 11 shows a crystalline silicon substrate 100 covered, in an order corresponding to the stack of the layers from the surface of the substrate 100, with a silica layer 101, with a single-crystal silicon layer 102, with a thin silica layer 105 approximately 10 nanometers in thickness, with a layer 103 of conductive polycrystalline silicon and with a layer 106 of silicon nitride ($Si_3N_4$) that forms a hard mask.

Two trenches T1 and T2 are hollowed out in several steps on either side of an island from the succession of layers, as far as the surface of the substrate 100, so as to form volumes 101a, 102a, 105a, 103a and 106a corresponding to portions of the respective layers 101, 102, 105, 103 and 106 (FIG. 12). To do this, a resin mask (not shown) is deposited on top of the layer 106. In a plane parallel to the surface of the substrate 100, the island has, for example, a rectangular shape extending as far as two opposed edges of the substrate 100, and the trenches T1 and T2 are straight and mutually parallel. They may be separated from each other by a distance of 0.10 microns for example, with this distance corresponding to the width of the volumes 101a, 102a and 103a in the plane of cross section of FIG. 12.

Further, various steps are carried out between some of the steps for hollowing out the trenches T1 and T2. Thus, the steps of removing the aforementioned resin mask, of depositing spacers by plasma-enhanced chemical vapor deposition (PE-CVD) and directional plasma etching, in order to remove from the spacers the material deposited on surfaces parallel to the surface of the substrate 100, are carried out. The structure shown in FIG. 12 is then obtained. In this structure, spacers 107a of silicon nitride ($Si_3N_4$) cover the edges of the layer 103 and of the volume 103a, at the inner and outer side walls of the trenches T1 and T2.

Figure 13:
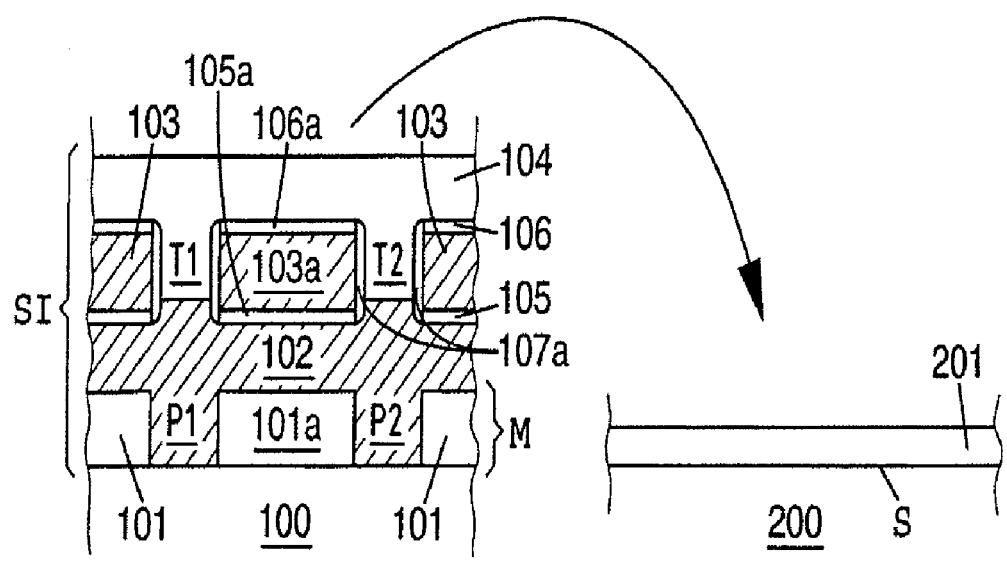

Single-crystal silicon is then deposited (FIG. 13) on the bottom of the trenches T1 and T2 by epitaxial growth from the exposed surface of the substrate 100 and from the sides of the layer 102 and of the volume 102a level with the trenches T1 and T2. This deposition is continued up to approximately a height level corresponding to the lower edges of the spacers 107a. A continuous single-crystal silicon layer 102 is thus obtained, which covers the volume 101a and the layer 101 and which furthermore has two parallel extensions P1 and P2 that fill the trenches T1 and T2, respectively, as far as the surface of the substrate 100. The extensions P1 and P2 inserted between the portions of layer 101 and the volume 101a constitute the pattern M according to the third embodiment of the present invention.

Figure 14:
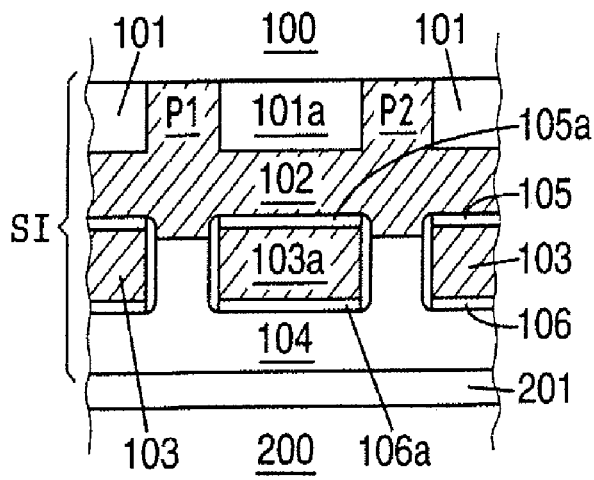
Figure 15:
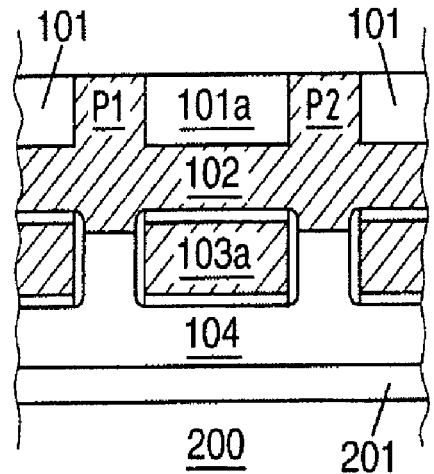

The obtained structure is completed by the deposition of a silica layer 104, which is polished on its upper face so as to have a plane surface free of asperities. The combination of the layers and volumes formed on the substrate 100 constitutes the initial structure SI be transferred onto a second substrate. To do this, a silicon substrate 200 is covered on one of its surfaces S with a silica layer 201 (FIG. 13) which is also strictly plane. The substrate 100 covered with the initial structure SI is then inverted and applied against the layer 201, with the layer 104 being brought against the layer 201. Because of the similarity of the materials of the layers 104 and 201, the mutual adhesion of their surfaces is strong. The configuration in FIG. 14 is then obtained, followed by that in FIG. 15 after the substrate 100 has been removed using one of the abovementioned methods.

Figure 16:
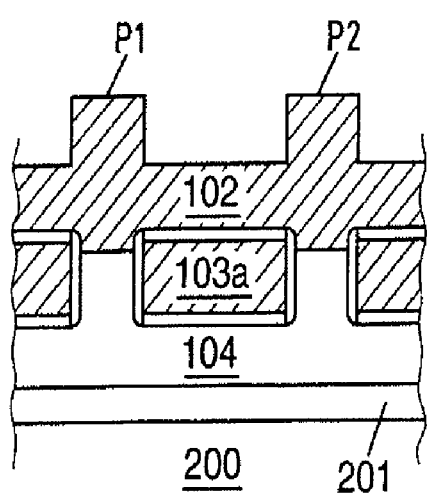
Figure 17:
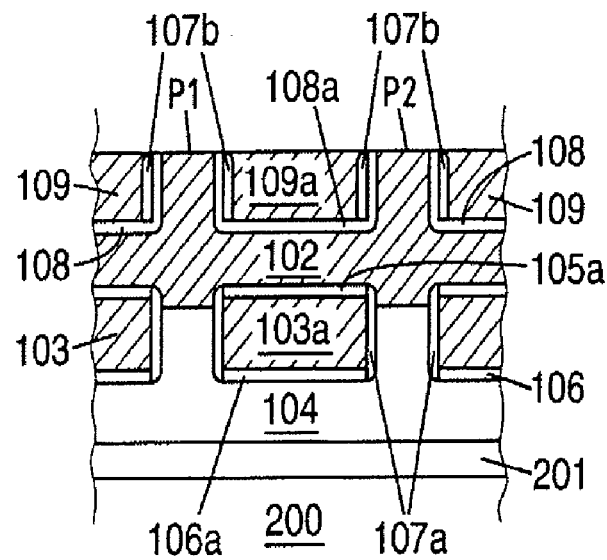

That surface of the initial structure SI on the side opposite to the substrate 200 then has exposed faces of the silica layer 101 and of the silica volume 101a. The extensions P1 and P2 of the single-crystal silicon layer 102 are also flush with this surface. Chemical etching of the "single damascene" type, known to those skilled in the art, is then carried out on this surface, to selectively remove the silica material from the layer 101 and from the volume 101a. The configuration in FIG. 16 is then obtained, in which the extensions P1 and P2 of the layer 102 constitute two parallel protuberances on top of the layer 102, and these form the pattern M according to this embodiment of the present invention.

The structure is then completed during the following steps, the methods of implementation of which known to those skilled in the art: creation by oxidation of a silica layer 108 on the free surface of the single-crystal silicon layer 102, deposition and etching of the spacers 107b, then deposition of conducting silicon so as to form the layer 109 and to fill the volume 109a. Finally, a mechanical abrasion operation brings the exposed surface down to the level of the single-crystal silicon material of the extensions P1 and P2 of the layer 102.

In this structure, the volumes 103a and 109a of conducting polycrystalline silicon constitute two gates flanking a channel formed by the single-crystal silicon layer 102. The gate 103a is electrically isolated from the channel by the layer portion 105a. The gate 109a is electrically isolated from the channel by the layer portion 108a created during the final abrasion. The spacers 107a and 107b also contribute to this electrical isolation. The extensions P1 and P2 of the layer 102 at the exposed surface constitute the source and the drain of the transistor.

By virtue of the method of the present invention, the two gates are precisely superposed in the direction D perpendicular to the surface of the substrate 200. In this third embodiment, the alignment between the structural parts produced before and after the transfer of substrates is obtained by virtue of the extensions P1 and P2 produced by epitaxy.

A fourth embodiment of the method of the present invention relates to the production of a DRAM memory element. Described below are only some of the steps in the fabrication of two capacitors associated with two write transistors, with these four electronic components forming part of the DRAM memory element. The following description is furthermore limited to the parts of components that appear in a cross-sectional view perpendicular to the surface of a substrate on which the memory element is produced.

Figure 18:
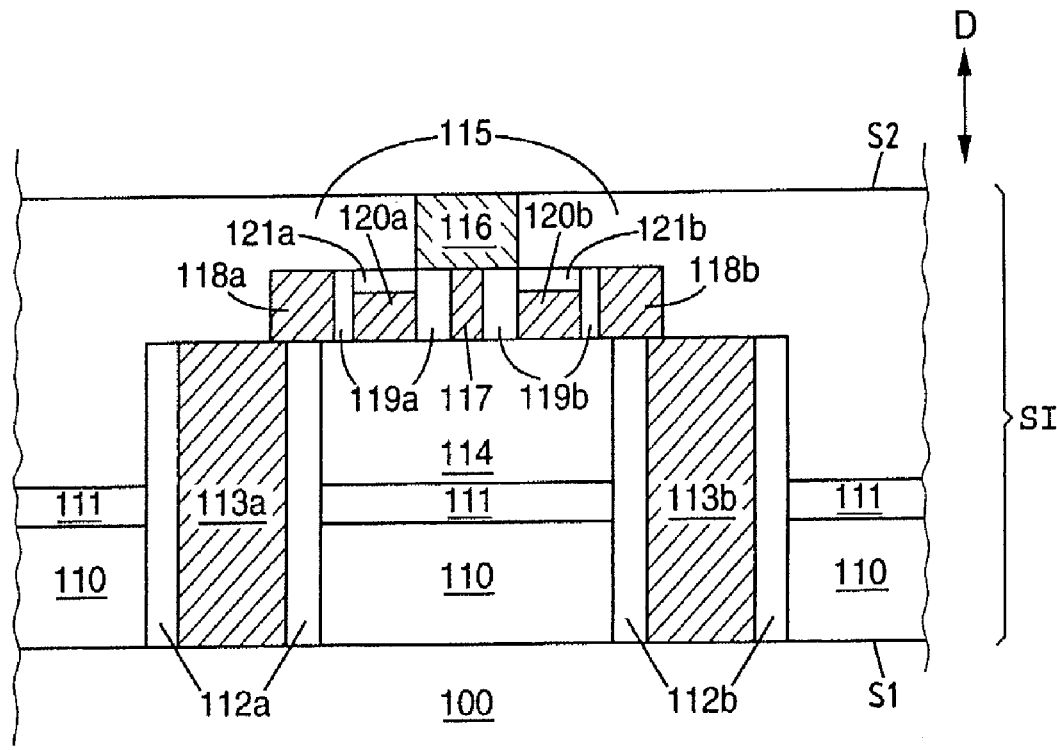
FIGS. 18 to 21 illustrate the production of part of a DRAM memory element by an embodiment of the method of the present invention.

FIG. 18 shows the initial structure SI used in this embodiment, which is produced on a surface S1 of a first substrate 100, for example made of silicon. This initial structure SI includes two superposed layers 110 and 111, made of silica ($SiO_2$) and silicon nitride ($Si_3N_4$) respectively, which cover the surface S1 away from two polycrystalline silicon wells 113a and 113b. These wells 113a and 113b are lined on their side walls perpendicular to the surface S1 with electrical insulation layers 112a and 112b. Between the two wells 113a and 113b lies a region 114 of doped silicon, for example doped with boron atoms. A central electrical contact terminating in the region 114 is formed by two superposed volumes 116 and 117, made of tungsten metal and of conducting silicon respectively. A thin layer of titanium nitride (TiN) (not shown) provides the interface between the two volumes 116 and 117.

Two gates 120a and 120b, placed symmetrically on either side of the volume 117, made of conducting silicon, are electrically isolated from the region 114 by layers of silica ($SiO_2$) (not shown), preferably having thicknesses of between 3 and 10 nanometers. Each of these two gates 120a and 120b is isolated from the volume 116 by a volume of silica 121a and 121b. The gates 120a and 120b and the isolating volumes 121a and 121b are surrounded, over their entire height in the direction D perpendicular to the surface S1 of the substrate 100, by insulating spacers made of silica, respectively 119a and 119b. Two source connections 118a and 118b, made of conducting silicon, establish electrical contacts between the ends of the region 114 and the wells 113a and 113b, respectively. An upper filling volume 115, made of silica, is placed so as to provide a plane contact surface S2 parallel to the surface S1.

The wells 113a and 113b, together with the layers 112a, 112b, 110 and 111, are intended to form the pattern according to the fourth embodiment of the present invention, which is used for fabricating the capacitors.

Figure 19:
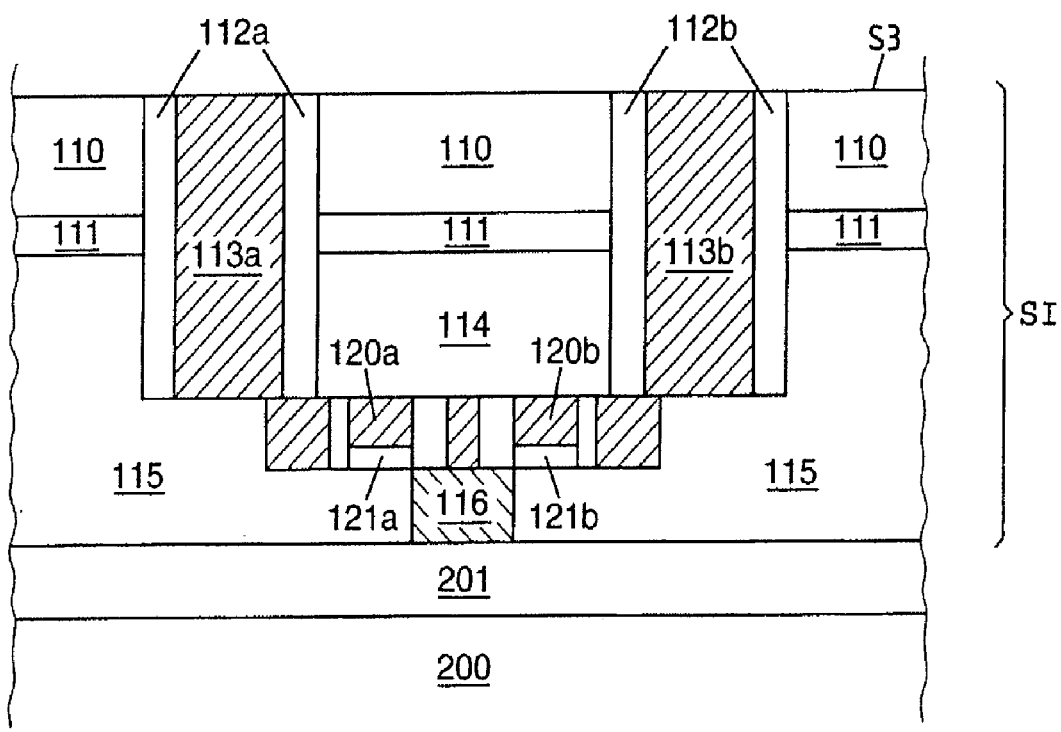

After inverting the above initial structure SI and transferring it onto the surface of a second substrate 200 covered with a silica adhesion layer 201, and then removing the first substrate 100, the configuration shown in FIG. 19 is obtained. In this configuration, the initial structure is unchanged, but inverted with respect to the surface of the support substrate. The surface S3 of the initial structure SI, on the side opposite to the substrate 200, then exposes the polycrystalline silicon material of the wells 113a and 113b.

Figure 20:
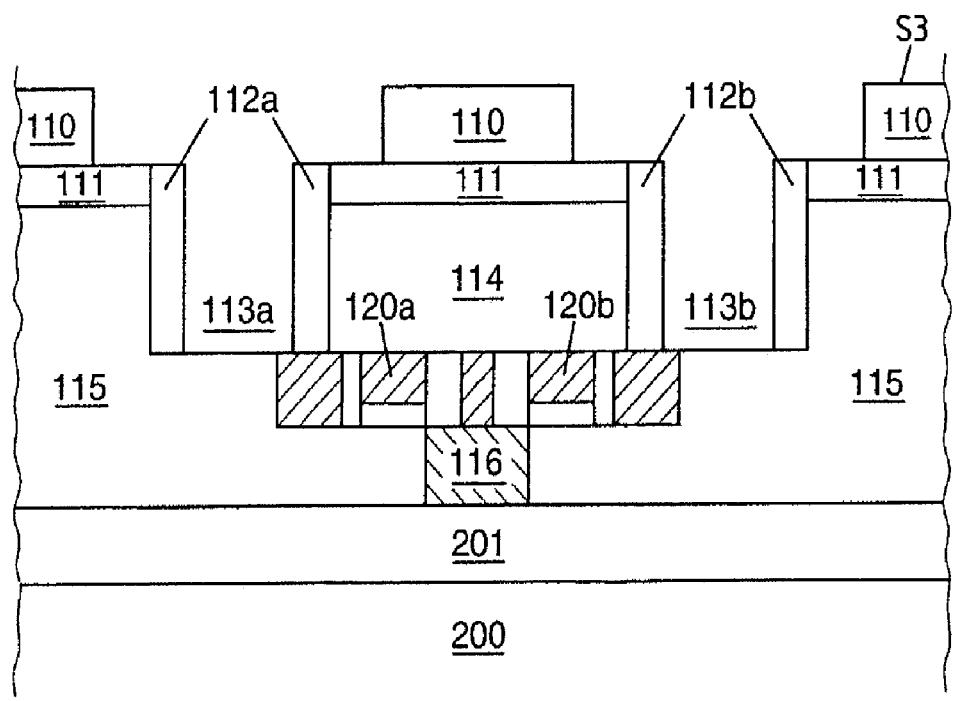

The surface S3 is then exposed to an isotropic dry etching plasma. The polycrystalline silicon, the silica ($SiO_2$) and the silicon nitride ($Si_3N_4$) have respective etch rates which decrease in this order. During plasma etching, the wells 113a and 113b are consequently stripped of most or all of their initial material, whereas the upper edges of these wells, formed by the silica of the layers 110, 112a and 112b, are only lowered. They then form, after etching, a widened mouth for the wells 113a and 113b on the surface S3 (FIG. 20). The portions of the silicon nitride layer 111 remain virtually unchanged.

Figure 21:
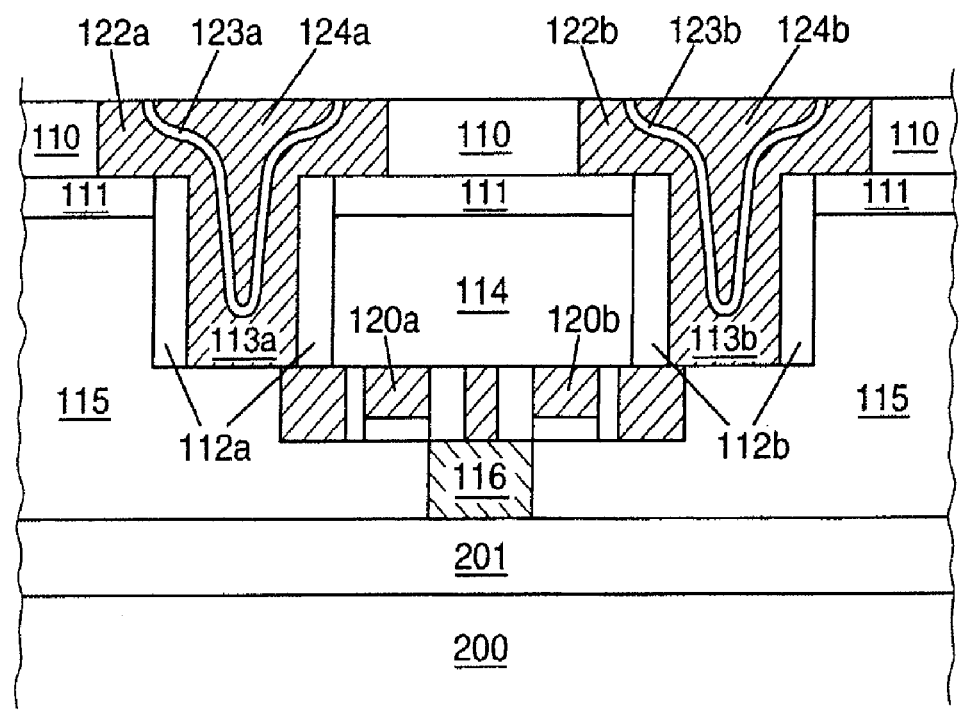

The recessed wells 113a and 113b are then filled in three successive steps in order to form a capacitor (FIG. 21) in each of the two wells 113a and 113b. In a first step, the two wells 113a and 113b are partially filled with a conducting material, such as a metal, or with silicon doped so that it is conducting. CMP polishing is carried out in order to remove any surplus of conducting material deposited on the portions of layer 110. First plates 122a and 122b of the capacitors are thus obtained in each of the two wells 113a and 113b, respectively. In a second step, two thin layers 123a and 123b based on dielectrics are then deposited on respective upper surfaces of the first plates 122a and 122b. Preferably, the layers 123a and 123b include a dielectric of high dielectric permittivity, such as silicon nitride ($Si_3N_4$) or titanium oxide ($TiO_2$). In a third step, deposition of conducting material, followed by CMP polishing, completes the filling of each of the two wells 113a and 113b. The second plates 124a and 124b thus obtained may be made of the same material as the first plates 122a and 122b.

In this fourth embodiment of the method of the present invention, the wells 113a and 113b constitute alignment reference marks for continuing the production of the structure after the initial structure SI has been transferred onto the second substrate 200. They are distinguished from the rest of the structure by their filling material, which is differentiated by its high etch rate.

Accordingly, the method of the present invention makes it possible to obtain complex structures of integrated components. The embodiments described above by way of illustration use several types of differentiated materials, together with several selective treatments. Other differentiated materials and other selective treatments, which provide the same self-alignment effect of a second structure part of integrated components with respect to a first structure part, or initial structure, produced beforehand, may also be used.

While there has been illustrated and described what are presently considered to be the preferred embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. A method of fabricating integrated electronic components, said method comprising the steps of:
   producing an initial structure on the surface of a first substrate, the initial structure including a plurality of volumes of materials, some of these volumes forming a defined pattern;
   transferring at least a part of the initial structure that includes the defined pattern from the first substrate onto a second substrate; and
   after transferring the part of the initial structure from the first substrate onto the second substrate, producing an additional structure on the second substrate using at least some of the volumes of materials of the defined pattern as self-alignment marks to self-align the additional structure with respect to the part of the initial structure that was transferred onto the second substrate.

2. The method of claim 1, wherein the transferring step includes the sub-steps of:
   inverting the first substrate;
   applying the first substrate against the second substrate via the initial structure; and
   removing the first substrate so as to leave at least part of the initial structure on the second substrate.

3. The method of claim 1, wherein the initial structure includes at least two stacked levels of volumes of material on the surface of the first substrate.

4. The method of claim 3, wherein the initial structure includes at least two volumes of material that cover at least some of the volumes of material forming the defined pattern.

5. The method of claim 1, wherein the step of producing an initial structure includes the sub-step of carrying out a treatment for differentiating at least one of the volumes of material forming the defined pattern from the other volumes of material forming the defined pattern.

6. The method of claim 5, wherein the treatment is at least one of: deposition of a defined material in the volume, implantation of chemical species in an initial material of the volume, and a chemical reaction generated in at least part of an initial material of the volume.

7. The method of claim 1, wherein the material of at least one of the volumes of the defined pattern is silicon-based.

8. The method of claim 1, wherein the material of at least one of the volumes of the defined pattern is silicon nitride-based.

9. The method of claim 1, further including the step of: between the transferring step and the step of producing an additional structure, providing an access to at least part of the volumes of the pattern.

10. The method of claim 9, further including the step of carrying out a selective treatment through the access, in order to distinguish at least one of the volumes of material forming the defined pattern from the other volumes of material forming the defined pattern.

11. The method of claim 10, wherein the selective treatment is at least one of: etching using a solution including chemical reactants, etching using a plasma, and deposition of a material.

12. The method of claim 10,
wherein the material of at least one of the volumes of the pattern is crystalline, and
the selective treatment includes deposition of a material by epitaxial growth from at least one surface of the crystalline material.

13. The method of claim 2, wherein the initial structure includes at least one upper volume via which the first substrate supporting the initial structure is applied against the second substrate, the material of the upper volume being suitable for adhering to the surface portion of the second substrate.

14. The method of claim 13, wherein the material suitable for adhering to the surface portion of the second substrate is based on a material chosen from: silicon, silica, a silicon-based material, and a silica-based material.

15. The method of claim 1, further comprising the step of:
after the transferring step, covering the second substrate with a material chosen from: silicon, silica, a silicon-based material, and a silica-based material.

16. An integrated electronic component fabricated by a method comprising the steps of:
producing an initial structure on the surface of a first substrate, the initial structure including a plurality of volumes of materials, some of these volumes forming a defined pattern;
transferring at least a part of the initial structure that includes the defined pattern from the first substrate onto a second substrate; and
after transferring the part of the initial structure from the first substrate onto the second rate producing an additional structure on the second substrate using at least some of the volumes of materials of the defined pattern as self-alignment marks of to self-align the additional structure with respect to the part of the initial structure that was transferred onto the second substrate.

17. The integrated electronic component according to claim 16, wherein the integrated electronic component comprises a transistor.

18. The integrated electronic component according to claim 16, wherein the integrated electronic component comprises a diode.

19. The integrated electronic component according to claim 16, wherein the integrated electronic component comprises at least a portion of a dynamic random access memory element.

20. An integrated circuit including at least one integrated electronic component that is fabricated by a method comprising the steps of:
producing an initial structure on the surface of a first substrate, the initial structure including a plurality of volumes of materials, some of these volumes forming a defined pattern;
transferring at least a part of the initial structure that includes the defined pattern from the first substrate onto a second substrate; and
after transferring the part of the initial structure from the first substrate onto the second rate producing an additional structure on the second substrate using at least some of the volumes of materials of the defined pattern as self-alignment marks f to self-align the additional structure with respect to the part of the initial structure that was transferred onto the second substrate.

21. The method of claim 1, wherein in the producing step, at least part of the additional structure is produced on top of the part of the initial structure that was transferred onto the second substrate.

22. The method of claim 1, wherein in the producing step, the self-alignment of the additional structure is self-obtained by material removal or deposition above the second substrate.

* * * * *

UNITED STATES PATENT AND TRADEMARK OFFICE
CERTIFICATE OF CORRECTION

PATENT NO. : 7,214,597 B2  Page 1 of 1
APPLICATION NO. : 10/421368
DATED : May 8, 2007
INVENTOR(S) : Philippe Coronel et al.

It is certified that error appears in the above-identified patent and that said Letters Patent is hereby corrected as shown below:

On the Title page, under "References Cited", under "U.S. Patent Documents", add --      6,329,265 B1    12/2001      Miyawaki et al.
        6,335,224 B1 *   1/2002       Peterson et al. ..................... 438/114
        6,392,144 B1 *   5/2002       Filter et al. ......................... 174/52.4
        6,701,779 B2 *   3/2004       Volant et al. ....................... 73/105
        6,709,949 B2 *   3/2004       Hübner ............................... 438/401
  2001/0032987 A1    10/2001     Narui et al. --.

On the Title page, under "References Cited", under "Other Publications", add -- Zingg et al., "Dual-Gate SOI CMOS Technology by Local Overgrowth (LOG)", Proceedings of the Annual SOS/SOI Technology Conference, XP 000167661, 1989. --.

Col. 14, line 31;
Claim 20, line 12, change "second rate producing" to -- second substrate, producing --.

Col. 14, line 34;
Claim 20, line 15, change "marks f to self-align" to -- marks to self-align --.

Signed and Sealed this

Twenty-ninth Day of January, 2008

JON W. DUDAS
*Director of the United States Patent and Trademark Office*